United States Patent
Sawahara et al.

(12) 
(10) Patent No.: US 11,476,846 B2
(45) Date of Patent: Oct. 18, 2022

(54) DRIVE CONTROL CIRCUIT

(71) Applicants: Kabushiki Kaisha Toshiba, Tokyo (JP); Toshiba Electronic Devices & Storage Corporation, Tokyo (JP)

(72) Inventors: Yuichi Sawahara, Yamato Kanagawa (JP); Hideaki Majima, Minato Tokyo (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/178,341

(22) Filed: Feb. 18, 2021

(65) Prior Publication Data

US 2022/0085805 A1 Mar. 17, 2022

(30) Foreign Application Priority Data

Sep. 15, 2020 (JP) .............................. JP2020-154310

(51) Int. Cl.

| H03K 17/687 | (2006.01) |
| H03K 3/015 | (2006.01) |
| H01L 27/118 | (2006.01) |
| H03K 17/0412 | (2006.01) |
| H03K 17/16 | (2006.01) |

(52) U.S. Cl.
CPC ...... *H03K 17/687* (2013.01); *H01L 27/11898* (2013.01); *H03K 3/015* (2013.01); *H03K 17/04123* (2013.01); *H03K 17/163* (2013.01)

(58) Field of Classification Search
CPC ... H01L 27/00; H01L 27/11898; H03K 17/00; H03K 17/687; H03K 19/00; H03K 19/00315; H03K 19/00361; H03K 19/00384; H03K 3/00; H03K 3/015; H03K 17/04123; H03K 17/163; H04L 25/00; H04L 25/0272; H04L 25/028

USPC ......................................................... 327/108
See application file for complete search history.

(56) References Cited

U.S. PATENT DOCUMENTS

| 6,836,179 B2 | 12/2004 | Mizuno et al. |
| 7,610,572 B2 | 10/2009 | Kanno et al. |
| 2006/0012406 A1* | 1/2006 | Huber ................. H03K 17/163 327/112 |

(Continued)

FOREIGN PATENT DOCUMENTS

| JP | 2003-168735 A | 6/2003 |
| JP | 2011-082764 A | 4/2011 |
| JP | 4846272 B2 | 12/2011 |

*Primary Examiner* — Menatoallah Youssef
*Assistant Examiner* — Dave Mattison
(74) *Attorney, Agent, or Firm* — Allen & Overy LLP (57) ABSTRACT

According to one embodiment, a drive control circuit includes a first transistor that supplies a current to a gate of an output transistor in response to a drive signal, a second transistor that supplies a current to a capacitor in response to the drive signal, a comparison circuit that compares a gate voltage of the output transistor and a voltage of the capacitor, a control signal generation circuit that generates a control signal in response to an output signal of the comparison circuit and the drive signal, and a third transistor that supplies a current to a gate of the output transistor in response to the control signal.

19 Claims, 6 Drawing Sheets

(56) References Cited

U.S. PATENT DOCUMENTS

| | | | |
|---|---|---|---|
| 2010/0079186 A1* | 4/2010 | Zannoth | H03K 17/167 327/333 |
| 2012/0033506 A1* | 2/2012 | Furutani | G11C 5/147 365/189.07 |
| 2014/0091850 A1* | 4/2014 | Kohama | H03K 17/06 327/382 |

* cited by examiner

DRIVE CONTROL CIRCUIT

CROSS-REFERENCE TO RELATED APPLICATIONS

The present application claims the benefit of priority to Japanese Patent Application No. 2020-154310 filed on Sep. 15, 2020, the entire contents of which Japanese Patent Application are incorporated by reference in the present application.

FIELD

The present embodiment generally relates to a drive control circuit.

BACKGROUND

A technique has conventionally been disclosed for a drive control circuit that controls on/off of an output transistor where a drive capability of a drive element that drives the output transistor is adjusted while a preliminarily stored threshold value is provided as a reference, so that both increasing of a switching speed of the output transistor and suppressing of EMI noise are attained. In a case of a configuration where a preliminarily stored threshold value for an output transistor is used, a storage circuit for the threshold value is needed, so that a circuit configuration is complicated. A drive control circuit is desired that is capable of detection of a threshold value for an output transistor and adjustment of a drive capability of a drive element in a simple configuration thereof.

DETAILED DESCRIPTION

According to one embodiment, a drive control circuit includes a first drive transistor that supplies a drive current to a gate of an output transistor in response to a drive signal, a first capacitor where a reference potential is applied to one end thereof, a second drive transistor that supplies a charging current to another end of the first capacitor in response to the drive signal, a first comparison circuit that compares a gate voltage of the output transistor and a voltage of the another end of the first capacitor and outputs a first detection signal based on a comparison result thereof, a first control signal generation circuit that generates a first control signal in response to the first detection signal and the drive signal, and a third drive transistor that supplies a drive current to the gate of the output transistor in response to the first control signal.

Hereinafter, a drive control circuit according to an embodiment will be explained in detail with reference to the accompanying drawings. Additionally, the present invention is not limited by such an embodiment.

First Embodiment

Figure 1:
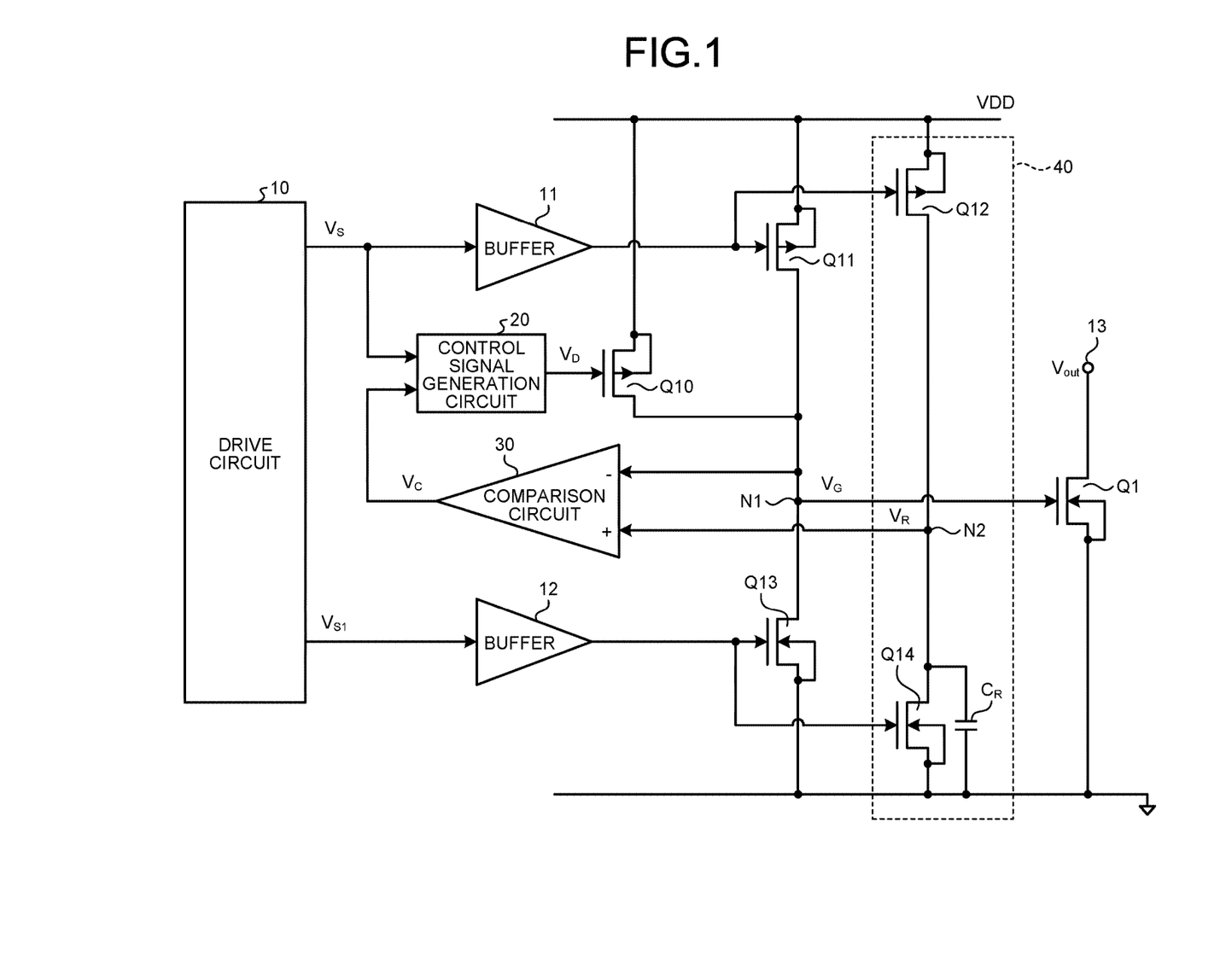
FIG. 1 is a diagram that illustrates a configuration of a drive control circuit according to a first embodiment.

FIG. 1 is a diagram that illustrates a configuration of a drive control circuit according to a first embodiment. The present embodiment has a drive circuit 10. The drive circuit 10 outputs switching signals $V_S$, $V_{S1}$. Switching signals $V_S$, $V_{S1}$ are provided with a so-called dead time in such a manner that drive transistors Q11 and Q13, and Q12 and Q14 are not simultaneously turned on.

The present embodiment has buffers 11, 12. The buffer 11 shapes a waveform of a switching signal $V_S$ and supplies it to a gate of the drive transistor Q11. The buffer 12 shapes a waveform of a switching signal $V_{S1}$ and supplies it to a gate of the drive transistor Q13.

A power source voltage VDD is applied to a source of the drive transistor Q11 and a drain thereof is connected to a drain of the drive transistor Q13. A common connection end N1 for drains of the drive transistors Q11 and Q13 is connected to a gate of an output transistor Q1. A drain of the output transistor Q1 is connected to an output end 13. A source of the drive transistor Q13 is grounded. The drive transistor Q11 supplies a drive current to a gate of the output transistor Q1 at a time of an on-state thereof. The drive transistor Q13 discharges a charge of a gate capacitance of the output transistor Q1 at a time of an on-state thereof.

The present embodiment has a reference voltage generation circuit 40. The reference voltage generation circuit 40 has the drive transistors Q12, Q14 and a capacitor $C_R$. One end of the capacitor $C_R$ is grounded, so that a ground potential that is provided as a reference potential is applied thereto. A power source voltage VDD is applied to a source of the drive transistor Q12 and a drain thereof is connected to a drain of the drive transistor Q14. A common connection end N2 for drains of the drive transistors Q12 and Q14 is connected to a non-inverting input end (+) of a comparison circuit 30. On/off of the drive transistors Q12, Q14 is controlled by outputs of the buffers 11, 12, respectively. The drive transistor Q12 supplies a charging current at a time of an on-state thereof so as to charge the capacitor $C_R$. The drive transistor Q14 discharges a charge of the capacitor $C_R$ at a time of an on-state thereof.

A value of the capacitor $C_R$ is set based on a time constant that is determined by a gate-source capacitance $C_{is}$ of the output transistor Q1 and a drive capability of the drive transistor Q11, and a drive capability of the drive transistor Q12. For example, setting is executed in such a manner that a period of time until a gate-source capacitance $C_{is}$ of the output transistor Q1 is charged by the drive transistor Q11 so as to provide a predetermined voltage and a period of time until the capacitor $C_R$ is charged by the drive transistor Q12 so as to provide such a predetermined voltage are identical. Therefore, a potential at one end of the capacitor $C_R$ and a potential at a source of the output transistor Q1 do not have to be identical potentials.

For example, in a case where a value of the capacitor $C_R$ is set at ½ of a gate-source capacitance $C_{GS}$ of the output transistor Q1, a drive capability of the drive transistor Q12 is provided as ½ of a drive capability of the drive transistor Q11. Thereby, it is possible to decrease a size of the drive transistor Q12 so as to reduce power consumption. Additionally, a drive capability as referred to herein means a supply capability for a drive current.

The present embodiment has the comparison circuit 30. An inverting input end (−) of the comparison circuit 30 is connected to the common connection end N1. The comparison circuit 30 compares a voltage of the common connection end N1, that is, a gate voltage $V_G$ of the output transistor Q1 and a voltage of the common connection end N2, that is, a reference voltage $V_R$ on a side of another end of the capacitor $C_R$ of the reference voltage generation circuit 40, and outputs a detection signal $V_C$ depending on a comparison result thereof.

The comparison circuit 30 has, for example, a hysteresis characteristic. As the comparison circuit 30 has a hysteresis characteristic, it is possible to avoid an incorrect operation of the comparison circuit 30 that is caused by, for example, noise or the like.

The present embodiment has a control signal generation circuit 20. The control signal generation circuit 20 is supplied with a detection signal $V_C$ and a switching signal $V_S$. The control signal generation circuit 20 outputs a control signal $V_D$ in response to a detection signal $V_C$ and a switching signal $V_S$. A control signal $V_D$ controls on/off of a drive transistor Q10. It is possible to provide the control signal generation circuit 20 that is composed of a latch circuit that responds to a detection signal $V_C$ and a switching signal $V_S$.

A drive capability of the drive transistor Q10 is set so as to be higher than a drive capability of the drive transistor Q11. For example, a size (gate width) of the drive transistor Q10 is provided so as to be greater than a size of the drive transistor Q11, so that it is possible to improve a drive capability of the drive transistor Q10.

Figure 2:
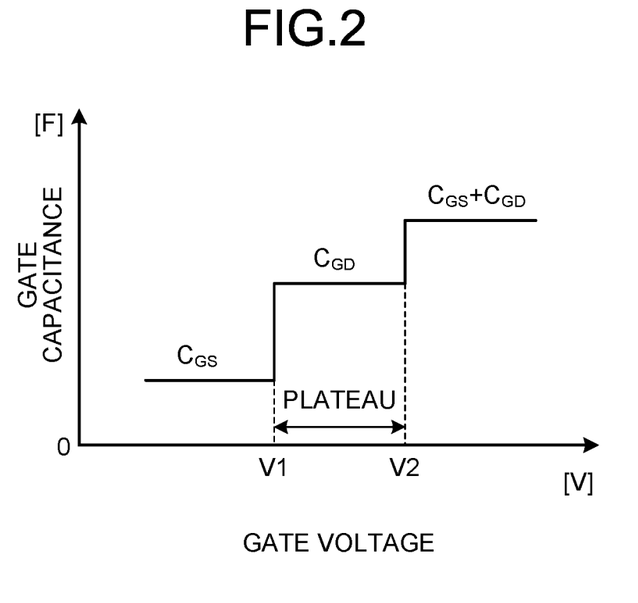
FIG. 2 is a diagram for explaining a change of a gate capacitance of an output transistor.

A circuit operation according to the present embodiment will be explained by using FIG. 2 to FIG. 4. FIG. 2 illustrates a relationship between a gate capacitance and a gate voltage of the output transistor Q1. A horizontal axis represents a gate voltage of the output transistor Q1 and a vertical axis represents a gate capacitance thereof. In a state where a gate voltage is lower than a threshold value, a gate capacitance of the output transistor Q1 is a gate-source capacitance $C_{GS}$. As a gate voltage is increased so as to be a threshold value, a gate capacitance is a gate-drain capacitance $C_{GD}$. As a gate voltage is increased so as to exceed a threshold value, a gate capacitance is a sum of $C_{GS}$ and $C_{GD}$, that is, $C_{GS}+C_{GD}$.

As a gate voltage reaches a threshold value, a gate capacitance of the output transistor Q1 is a gate-drain capacitance $C_{SD}$ and a "plateau" is caused where the gate voltage is constant at an interval of V1 to V2. In the present embodiment, a gate voltage of the output transistor Q1 at such an interval of plateau is detected as a threshold value for the output transistor Q1.

The capacitor $C_R$ of the reference voltage generation circuit 40 is charged by a drive current from the drive transistor Q12, so that a reference voltage $V_R$ rises at a constant slope. On the other hand, a gate voltage $V_G$ of the output transistor Q1 is constant at a plateau that is caused at a threshold value. Hence, as a gate voltage $V_G$ is compared with a reference voltage $V_R$, it is possible to readily detect that the gate voltage $V_G$ reaches a threshold value for the output transistor Q1.

Figure 3:
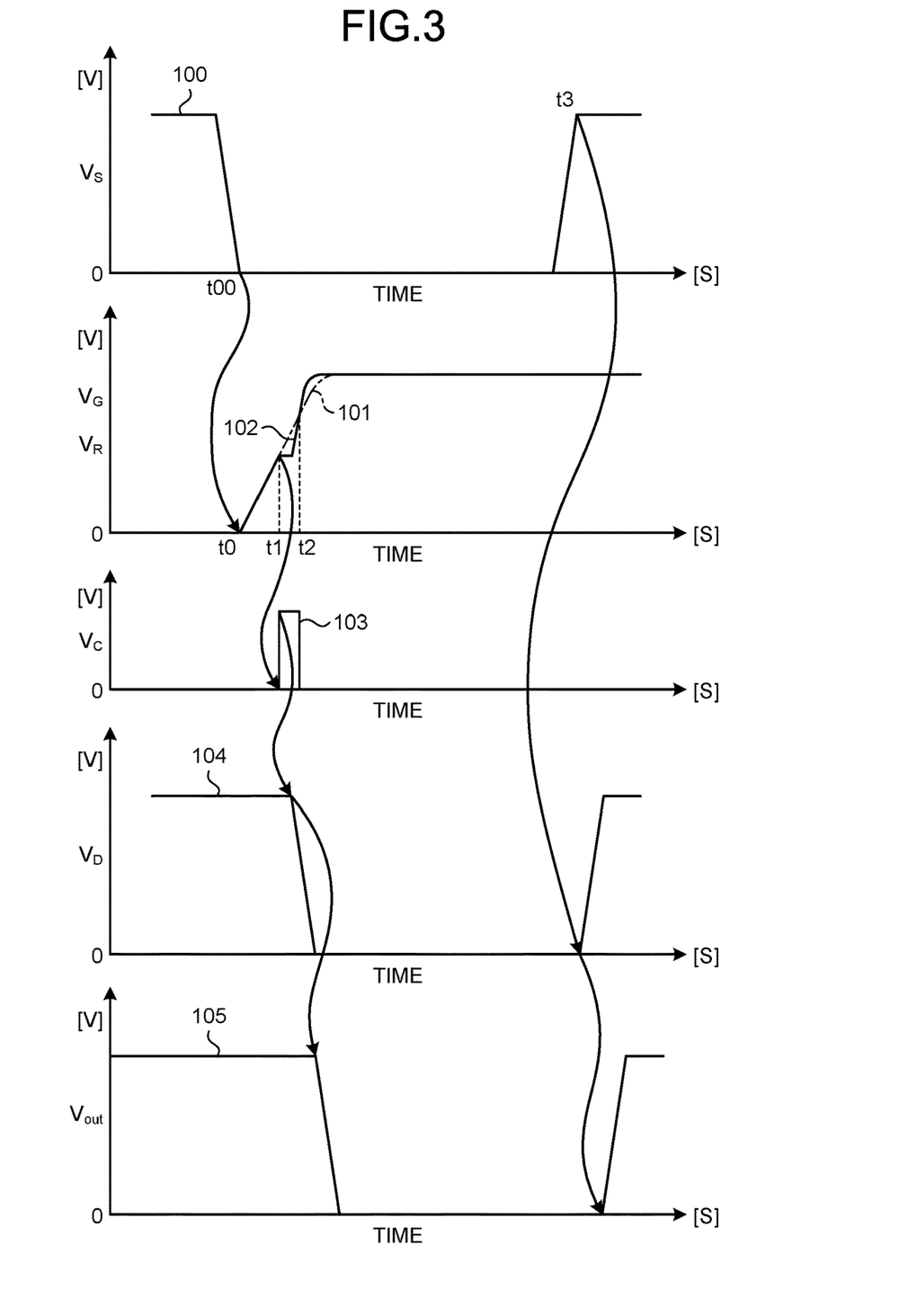
FIG. 3 is a diagram that schematically illustrates a voltage relationship among respective nodes.

FIG. 3 is a diagram that schematically illustrates a voltage relationship among respective nodes. A solid line 100 in an upper section represents a switching signal $V_S$. At a timing t00, a switching signal $V_S$ is provided at an L level.

A next section illustrates a gate voltage $V_G$ and a reference voltage $V_R$. A dashed-dotted line 101 represents a reference voltage $V_R$ and a solid line 102 represents a gate voltage $V_G$. The drive transistors Q11, Q12 are turned on in response to a switching signal $V_S$, and a reference voltage $V_R$ and a gate voltage $V_G$ of the output transistor Q1 start to rise at a timing t0. Detection is executed in such a manner that a reference voltage $V_R$ is higher than a gate voltage $V_G$ at a timing t1 and reaches a threshold value for the output transistor Q1. A gate voltage $V_G$ is higher than a reference voltage $V_R$ at a timing t2.

A solid line 103 in a next section represents a detection signal $V_C$ of the comparison circuit 30. The comparison circuit 30 outputs a detection signal $V_C$ at an H level at a timing t1 when a reference voltage $V_R$ is higher than a gate voltage $V_G$.

A solid line 104 in a next section represents a control signal $V_D$ that is output by the control signal generation circuit 20. A control signal $V_D$ transits to an L level in response to a detection signal $V_C$ at an H level so as to turn on the drive transistor Q10. Thereby, a supply capability for a drive current to a gate of the output transistor Q1 is improved. The control signal generation circuit 20 maintains an L level until a timing t3 when a switching signal $V_S$ is provided at an H level.

A solid line 105 in a lower section represents an output voltage $V_{out}$. As a gate voltage $V_G$ of the output transistor Q1 reaches a threshold value, a gate of the output transistor Q1 is charged by a current where a drive current from the drive transistor Q11 and a drive current from the drive transistor Q10 are added, and an output voltage $V_{out}$ of the output end 13 instantaneously transits to an L level. The output transistor Q1 is turned off at a timing t3 when a switching signal $V_S$ is provided at an H level, so that an output voltage $V_{out}$ is provided at an H level.

According to the present embodiment, it is possible to readily detect that a gate voltage $V_G$ of the output transistor Q1 reaches a threshold value, by comparison between the gate voltage $V_G$ and a reference voltage $V_R$. Until a gate voltage $V_G$ reaches a threshold value, only the drive transistor Q11 with a low drive capability is operated so as to suppress an inrush current to a gate of the output transistor Q1. Thereby, EMI noise is reduced. Furthermore, after detecting that a gate voltage $V_G$ reaches a threshold value, the drive transistor Q10 with a high drive capability is turned on and is driven together with the drive transistor Q11, so that a drive capability is improved. Thereby, it is possible to increase a switching speed of the output transistor Q1.

Figure 4:
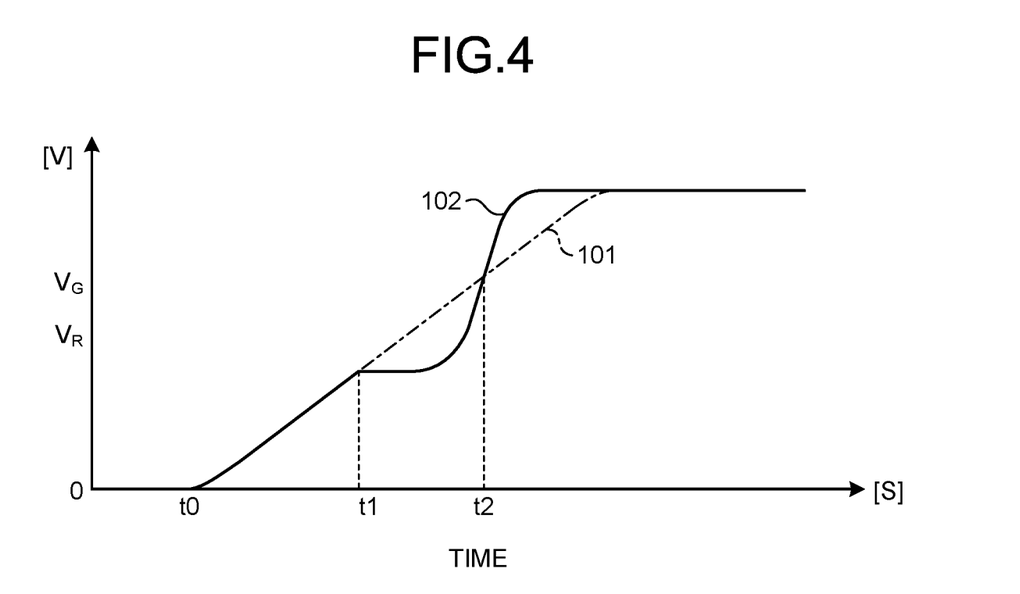
FIG. 4 is a diagram for explaining a relationship between a gate voltage of an output transistor and a reference voltage.

FIG. 4 illustrates a relationship between a gate voltage $V_G$ and a reference voltage $V_R$ in an enlarged manner. A dashed-dotted line 101 represents a reference voltage $V_R$ and a solid line 102 represents a gate voltage $V_G$. As the drive transistor Q12 is turned on in response to a switching signal $V_S$, charging of the capacitor $C_R$ of the reference voltage generation circuit 40 starts at a timing to, so that a reference voltage $V_R$ starts to rise. On the other hand, as the drive transistor Q11 is turned on at a timing t0, a gate voltage $V_G$ of the output transistor Q1 also rises, and is provided so as to be constant at a timing t1 when a plateau is caused.

A timing t1 is detected by the comparison circuit 30. As the drive transistor Q10 with a high drive capability is turned on by a control signal $V_D$ that responds to a detection signal $V_C$ of the comparison circuit 30, a gate voltage $V_G$ of the output transistor Q1 rises steeply and is higher than a reference voltage $V_R$ at a timing t2.

Figure 5:
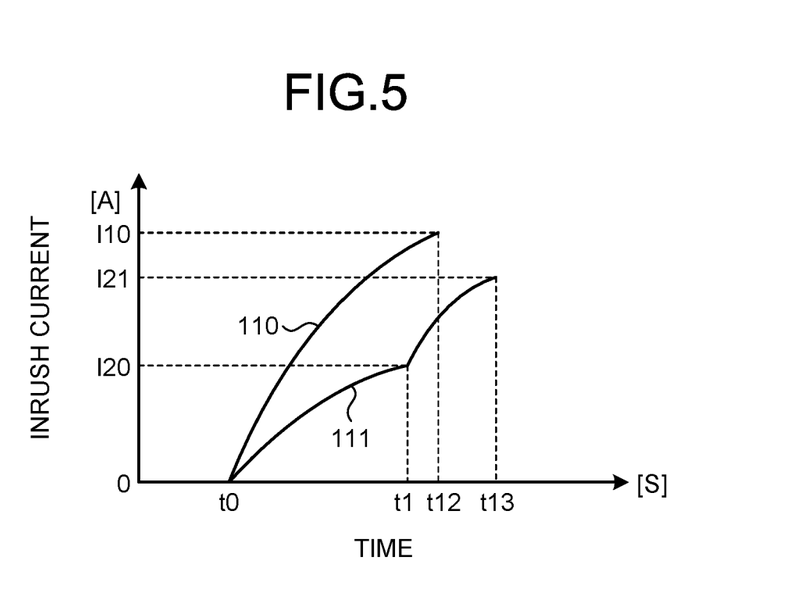
FIG. 5 is a diagram for explaining an effect of a first embodiment.

FIG. 5 is a diagram for explaining an effect of the present embodiment. A horizontal axis represents a time and a vertical axis schematically represents an inrush current to a gate of the output transistor Q1. A solid line 110 in that figure represents a case where the output transistor Q1 is driven by using only a drive transistor with a high drive capability.

In a case where driving is executed by a drive transistor with a high drive capability, an inrush current reaches a current value I10 during a short period of time from a timing t0 when turning on is executed in response to a switching signal $V_S$ to t12. Because a drive capability is high, a peak value of an inrush current is a high current value 110. A solid line 111 represents a case of the present embodiment. Until a timing t1 when a gate voltage $V_G$ is a threshold value, driving is executed by the drive transistor Q11 with a low drive capability. Hence, an inrush current is suppressed so as to be 120. As an inrush current is suppressed, a gate voltage $V_G$ of the output transistor Q1 rises gently. Thereby, a rate of change dV/dt of a gate voltage $V_G$ is decreased, so that EMI noise is suppressed.

After a timing t1 when it reaches a threshold value, the drive transistor Q10 with a high drive capability is turned on, and is operated together with the drive transistor Q11, so that a drive capability is improved. Thereby, a switching speed of the output transistor Q1 is increased. At a timing t1, a gate voltage $V_G$ of the output transistor Q1 has already risen, so that an inrush current is suppressed, and is also suppressed so as to be 121 at a timing t13.

According to the present embodiment, it is possible to readily detect that a gate voltage $V_G$ of the output transistor Q1 reaches a threshold value, by executing comparison with a reference voltage $V_R$ of the reference voltage generation circuit 40. It is possible to adjust a timing t1 when a threshold value of the output transistor Q1 is detected, by a configuration of the reference voltage generation circuit 40. For example, an (non-illustrated) inductor is connected in series between the capacitor $C_R$ and a drain of the drive transistor Q14, so that it is possible to delay charging of the capacitor $C_R$. Thereby, rising of a reference voltage $V_R$ is delayed, so that it is possible to delay a timing t1 when detection is executed in such a manner that a gate voltage $V_G$ reaches a threshold value.

For example, in a case where the output transistor Q1 is a GaN transistor that is composed of GaN (gallium nitride), the GaN transistor may be composed of another chip and be connected to the drive transistors Q11, Q13 by a predetermined wiring. In a case of such a configuration, a parasitic inductance component is present in the wiring, so that it is possible to cancel delay that is caused by the parasitic inductance component of the wiring, by connecting an inductor to the capacitor $C_R$.

According to the present embodiment, a reference voltage $V_R$ of the capacitor $C_R$ of the reference voltage generation circuit 40 and a gate voltage $V_G$ of the output transistor Q1 are compared, and the gate voltage $V_G$ at a plateau interval where the gate voltage $V_G$ is flat is detected as a threshold value voltage. Therefore, a configuration to inform abnormality in a case where a value of a reference voltage $V_R$ at a time when the comparison circuit 30 outputs a detection signal $V_C$ departs from a range of an assumed threshold value may be provided. For example, the drive transistors Q12, Q14 of the reference voltage generation circuit 40 are turned off in response to a detection signal $V_C$ at an H level of the comparison circuit 30, so that it is possible to cause the capacitor $C_R$ to hold a reference voltage $V_R$ that corresponds to a threshold value for the output transistor Q1. A held voltage is compared with a voltage that is assumed as a threshold value, so that it is possible to determine whether or not an abnormal state is caused.

Second Embodiment

Figure 6:
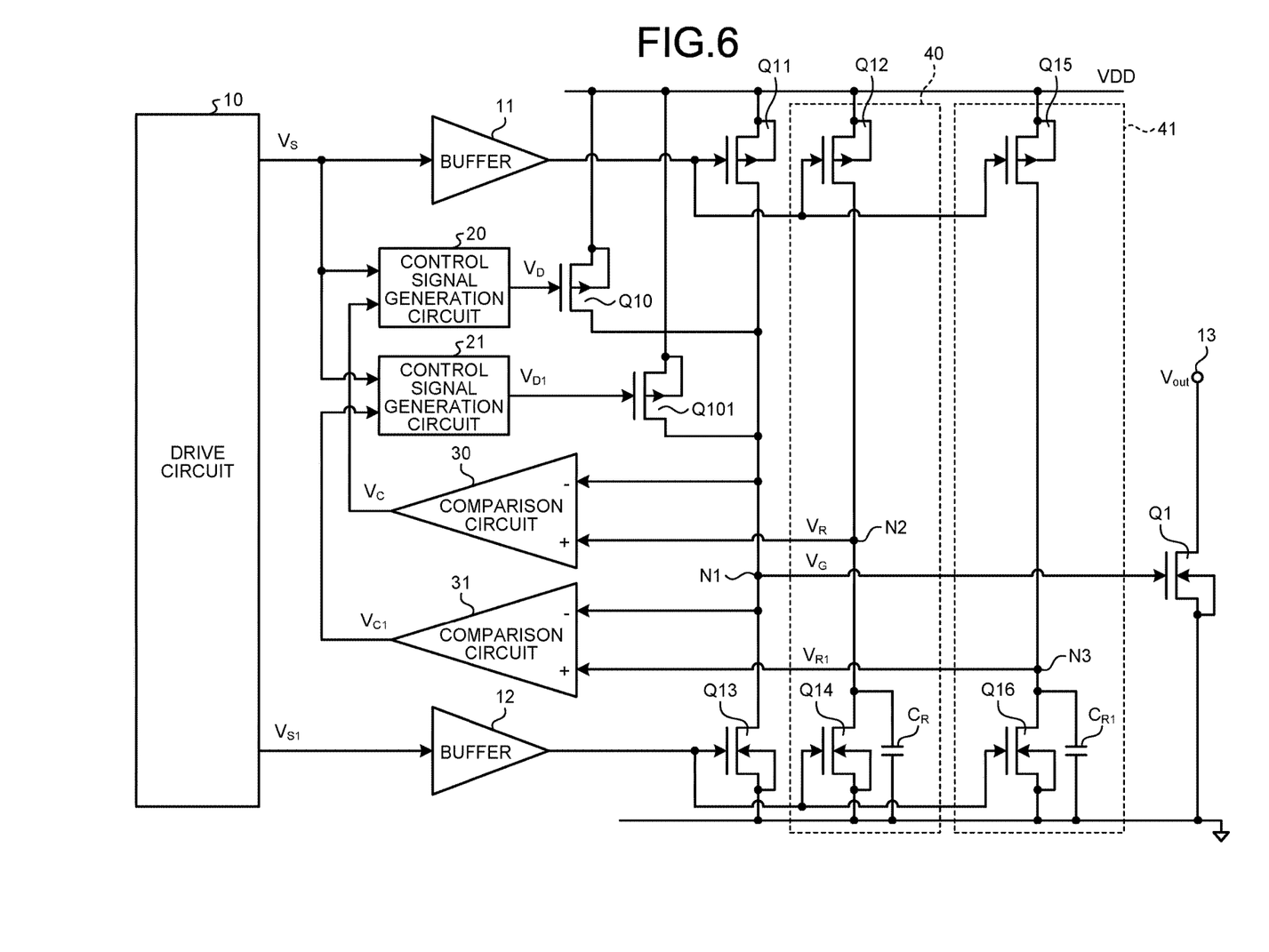
FIG. 6 is a diagram that illustrates a configuration of a drive control circuit according to a second embodiment.

FIG. 6 is a diagram that illustrates a configuration of a drive control circuit according to a second embodiment. A component that corresponds to that of the embodiment as already described will be provided with an identical sign to provide a redundant description in only a needed case. Hereinafter, the same applies.

The present embodiment has a reference voltage generation circuit 41. The reference voltage generation circuit 41 has drive transistors Q15, Q16 and a capacitor $C_{R1}$. A gate of the drive transistor Q15 is supplied with an output signal of the buffer 11 and a gate of the drive transistor Q16 is supplied with an output signal of the buffer 12. A power source voltage VDD is applied to a source of the drive transistor Q15 and a drain thereof is connected to a drain of the drive transistor Q16. A source of the drive transistor Q16 is grounded. One end of the capacitor $C_{R1}$ is grounded and a ground potential that is provided as a reference voltage is applied thereto. Another end of the capacitor $C_{R1}$ is connected to a common connection end N3 for drains of the drive transistors Q15 and Q16. The drive transistor Q15 supplies a charging current at a time of an on-state thereof so as to charge the capacitor $C_{R1}$. The drive transistor Q16 discharges a charge of the capacitor $C_{R1}$ at a time of an on-state thereof. On/off of the drive transistors Q15, Q16 is controlled by outputs of the buffers 11, 12, respectively.

The present embodiment has a comparison circuit 31. The comparison circuit 31 compares a gate voltage $V_G$ and a reference voltage $V_{R1}$ of the common connection end N3, and outputs a detection signal $V_{C1}$ depending on a comparison result thereof. As a reference voltage $V_{R1}$ that is applied to a non-inverting input end (+) thereof is higher than a gate voltage $V_G$, the comparison circuit 31 provides a detection signal $V_{C1}$ at an H level.

The present embodiment has a control signal generation circuit 21. The control signal generation circuit 21 outputs a control signal $V_{D1}$ in response to a detection signal $V_{C1}$ of the comparison circuit 31 and a switching signal $V_S$. A control signal $V_{D1}$ controls on/off of a drive transistor Q101. A drive capability of the drive transistor Q101 is set so as to be a value that is higher than that of the drive transistor Q11.

Figure 7:
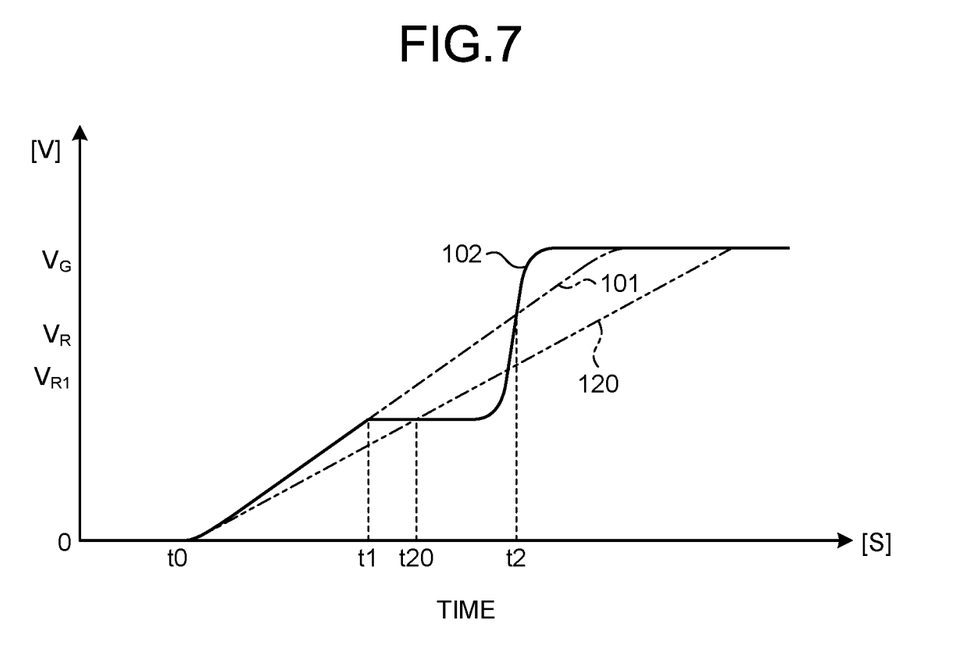
FIG. 7 is a diagram for explaining a relationship between a gate voltage of an output transistor and a reference voltage.

An operation of the present embodiment will be explained by using FIG. 7. FIG. 7 illustrates a gate voltage $V_G$ and reference voltages $V_R$, $V_{R1}$. A dashed-dotted line 101 represents a reference voltage $V_R$, a solid line 102 represents a gate voltage $V_G$, and a dashed-two-dotted line 120 represents a reference voltage $V_{R1}$. As explained in an operation of the first embodiment, a gate voltage $V_G$ of the output transistor Q1 is a plateau at a threshold value. Hence, a reference voltage $V_R$ is higher than a gate voltage $V_G$ at a timing t1. Such a voltage relationship is detected by the comparison circuit 30 and control is executed so as to turn on the drive transistor Q10 with a high drive capability.

Similarly, a reference voltage $V_{R1}$ as represented by a dashed-two-dotted line 120 is also higher than a gate voltage $V_G$ at a timing t20. Such a voltage relationship is detected by the comparison circuit 31 and the comparison circuit 31 generates a detection signal $V_{C1}$ at an H level at a timing t20 and supplies it to the control signal generation circuit 21. The control signal generation circuit 21 supplies a control signal $V_{D1}$ at an L level to the drive transistor Q101 in response to a detection signal $V_{C1}$ and turns on the drive transistor Q101. As the drive transistor Q101 is turned on, a solid line 102 that represents a gate voltage $V_G$ is changed where illustration thereof is omitted for simplification.

In the present embodiment, at a timing t20 when a reference voltage $V_{R1}$ is higher than a gate voltage $V_G$, the drive transistor Q101 with a high drive capability is turned on. That is, in addition to adjustment to turn on the drive transistor Q10 with a high drive capability depending on a comparison operation for a reference voltage $V_R$ and a gate voltage $V_G$, the drive transistor Q101 with a high drive capability is turned on depending on a comparison operation for a reference voltage $V_{R1}$ and the gate voltage $V_G$, so that adjustment of a drive capability is executed. Hence, fine adjustment of a drive capability is possible.

It is possible to readily provide the reference voltage generation circuit 41 that is composed of the drive transistors Q15, Q16 and the capacitor $C_{R1}$. Furthermore, it is possible to adjust a slope of a change of a reference voltage $V_{R1}$ by a value of the capacitor $C_{R1}$ and a value of a drive current of the drive transistor Q15. Therefore, it is possible to readily adjust a slope of a change of a reference voltage $V_R$ of the reference voltage generation circuit 40 and a slope of a change of a reference voltage $V_{R1}$ of the reference voltage generation circuit 41, by adjustment of values of the capacitors $C_R$, $C_{R1}$ and drive capabilities of the drive transistors Q12, Q15. As slopes of changes of reference voltages $V_R$, $V_{R1}$ are adjusted, adjustment of timings t1, t20 when threshold values are detected, that is, timings when the drive transistors Q10, Q101 with a high drive capability are turned on is possible.

As charging currents to the capacitors $C_R$, $C_{R1}$ are delayed, it is possible to delay a timing when a threshold value for the output transistor Q1 is detected. For example, an (non-illustrated) inductor is connected between the capacitors $C_R$, $C_{R1}$ and the common connection ends N2, N3, so that it is possible to delay charging of the capacitors $C_R$, $C_{R1}$. Thereby, rising of reference voltages $V_R$, $V_{R1}$ is delayed, so that it is possible to delay timings t1, t20 when they intersect with a gate voltage $V_G$.

Although the control signal generation circuits 20, 21 according to the embodiment as already described have a configuration so as to respond to detection signals $V_C$, $V_{C1}$ at an H level of the comparison circuits 30, 31 and subsequently output control signals $V_D$, $V_{D1}$ at an L level until a timing t3 when a switching signal $V_S$ is provided at an H level, a configuration may be provided so as to output control signals $V_D$, $V_{D1}$ with output levels that are changed every time detection signals $V_C$, $V_{C1}$ of the comparison circuits 30, 31 are changed to an H level or an L level. In a case where detection signals of the comparison circuits 30, 31 are at an L level, only the drive transistor Q11 with a low drive capability is operated so as to suppress an inrush current, and the drive transistors Q10, Q101 with a high drive capability are turned on every time detection signals $V_C$, $V_{C1}$ are provided at an H level, so that it is possible to improve a drive capability and thereby increase a switching speed of the output transistor Q1.

Although some embodiments of the present invention have been explained, these embodiments are presented as examples and are not intended to limit the scope of the invention. These novel embodiments are capable of being implemented in various other modes and it is possible to execute a variety of omissions, substitutions, and modifications without departing from the spirit of the invention. These embodiments and variations thereof are included in the scope and/or spirit of the invention and are included in the scope of the invention as recited in what is claimed and equivalents thereof.

What is claimed is:

1. A drive control circuit, comprising:
    a first drive transistor that supplies a drive current to a gate of an output transistor in response to a drive signal;
    a first capacitor where a reference potential is applied to one end thereof;
    a second drive transistor that supplies a charging current to another end of the first capacitor in response to the drive signal;
    a first comparison circuit that compares a gate voltage of the output transistor and a voltage of the another end of the first capacitor and outputs a first detection signal based on a comparison result thereof;
    a first control signal generation circuit that generates a first control signal in response to the first detection signal and the drive signal; and
    a third drive transistor that supplies a drive current to the gate of the output transistor in response to the first control signal.

2. The drive control circuit according to claim 1, wherein a drive capability of the third drive transistor is higher than a drive capability of the first drive transistor.

3. The drive control circuit according to claim 1, wherein a size of the third drive transistor is greater than a size of the first drive transistor.

4. The drive control circuit according to claim 2, wherein a value of the first capacitor is set based on a time constant that is determined by a gate-source capacitance of the output transistor and a drive capability of the first drive transistor, and a drive capability of the second drive transistor.

5. The drive control circuit according to claim 1, wherein a value of the first capacitor is set in such a manner that a period of time until a gate-source capacitance of the output transistor is charged by the first drive transistor to provide a predetermined voltage and a period of time until the first capacitor is charged by the second drive transistor to provide the predetermined voltage are identical.

6. The drive control circuit according to claim 1, wherein the first comparison circuit has a hysteresis characteristic.

7. The drive control circuit according to claim 1, comprising:
    a fourth drive transistor that discharges a charge of a gate-source capacitance of the output transistor in response to a second drive signal; and
    a fifth drive transistor that discharges a charge of the first capacitor in response to the second drive signal.

8. The drive control circuit according to claim 1, comprising:
    a second capacitor where the reference potential is applied to one end thereof;
    a sixth drive transistor that supplies a charging current to another end of the second capacitor in response to the drive signal;
    a second comparison circuit that compares a gate voltage of the output transistor and a voltage of the another end of the second capacitor and outputs a second detection signal depending on a comparison result thereof;
    a second control signal generation circuit that generates a second control signal in response to the second detection signal and the drive signal; and
    a seventh drive transistor that supplies a drive current to the gate of the output transistor in response to the second control signal.

9. The drive control circuit according to claim 8, wherein a drive capability of the seventh drive transistor is higher than a drive capability of the first drive transistor.

10. The drive control circuit according to claim 8, wherein a size of the seventh drive transistor is greater than a size of the first drive transistor.

11. The drive control circuit according to claim 1, wherein the output transistor is a GaN transistor.

12. A drive control circuit, comprising:
a first drive transistor that supplies a drive current to a gate of an output transistor in response to a drive signal;
a first capacitor where a reference potential is applied to one end thereof;
a second drive transistor that supplies a charging current to another end of the first capacitor in response to the drive signal;
a first comparison circuit that compares a gate voltage of the output transistor and a voltage of the another end of the first capacitor and outputs a first detection signal based on a comparison result thereof;
a first control signal generation circuit that generates a first control signal in response to the first detection signal and the drive signal; and
a third drive transistor that supplies a drive current to the gate of the output transistor in response to the first control signal, wherein
a value of the first capacitor is set in such a manner that a period of time until a gate-source capacitance of the output transistor is charged by the first drive transistor to provide a predetermined voltage and a period of time until the first capacitor is charged by the second drive transistor to provide the predetermined voltage are identical.

13. The drive control circuit according to claim 12, wherein a size of the third drive transistor is greater than a size of the first drive transistor.

14. The drive control circuit according to claim 12, comprising:
a fourth drive transistor that discharges a charge of a gate-source capacitance of the output transistor in response to a second drive signal; and
a fifth drive transistor that discharges a charge of the first capacitor in response to the second drive signal.

15. The drive control circuit according to claim 12, wherein the output transistor is a GaN transistor.

16. A drive control circuit, comprising:
a drive circuit that outputs first and second drive signals;
a first drive transistor that supplies a drive current to a gate of an output transistor in response to the first drive signal;
a first capacitor where a reference potential is applied to one end thereof;
a second drive transistor that supplies a charging current to another end of the first capacitor in response to the first drive signal;
a first comparison circuit that compares a gate voltage of the output transistor and a voltage of the another end of the first capacitor and outputs a first detection signal based on a comparison result thereof;
a first control signal generation circuit that generates a first control signal in response to the first detection signal and the first drive signal;
a third drive transistor that has a drive capability that is higher than a drive capability of the first drive transistor and supplies a drive current to a gate of the output transistor in response to the first control signal;
a second capacitor where the reference potential is applied to one end thereof;
a fourth drive transistor that supplies a charging current to another end of the second capacitor in response to the first drive signal;
a second comparison circuit that compares a gate voltage of the output transistor and a voltage of the another end of the second capacitor and outputs a second detection signal depending on a comparison result thereof;
a second control signal generation circuit that generates a second control signal in response to the second detection signal and the first drive signal; and
a fifth drive transistor that has a drive capability that is higher than a drive capability of the first drive transistor and supplies a drive current to the gate of the output transistor in response to the second control signal.

17. The drive control circuit according to claim 16, wherein setting thereof is executed in such a manner that a period of time until a gate-source capacitance of the output transistor is charged by the first drive transistor to provide a predetermined voltage and a period of time until the first capacitor is charged by the second drive transistor to provide the predetermined voltage are identical.

18. The drive control circuit according to claim 16, wherein sizes of the third and fifth drive transistors are greater than a size of the first drive transistor.

19. The drive control circuit according to claim 16, comprising:
a sixth drive transistor that discharges a charge of a gate-source capacitance of the output transistor in response to the second drive signal;
a seventh drive transistor that discharges a charge of the first capacitor in response to the second drive signal; and
an eighth drive transistor that discharges a charge of the second capacitor in response to the second drive signal.

* * * * *